(12) United States Patent
Tian et al.

(10) Patent No.: US 9,118,317 B2
(45) Date of Patent: Aug. 25, 2015

(54) TRANSMITTER SWING CONTROL CIRCUIT AND METHOD

(75) Inventors: Kathy Tian, Sunnyvale, CA (US); Harry Muljono, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/609,052

(22) Filed: Sep. 10, 2012

(65) Prior Publication Data

US 2014/0070845 A1    Mar. 13, 2014

Related U.S. Application Data

(63) Continuation of application No. 12/387,695, filed on May 6, 2009, now Pat. No. 8,264,253, which is a continuation of application No. 11/729,209, filed on Mar. 27, 2007, now Pat. No. 7,541,838.

(51) Int. Cl.
| | |
|---|---|
| *H04L 25/02* | (2006.01) |
| *H03K 19/094* | (2006.01) |
| *H03K 19/0175* | (2006.01) |
| *H03K 19/003* | (2006.01) |
| *H03F 3/45* | (2006.01) |

(52) U.S. Cl.
CPC .............. *H03K 19/0175* (2013.01); *H03F 3/45* (2013.01); *H03K 19/00369* (2013.01); *H03K 19/00384* (2013.01); *H04L 25/02* (2013.01)

(58) Field of Classification Search
CPC .. H04L 25/0272; H04L 5/028; H04L 25/0292
USPC ............ 326/82, 83, 86, 87, 68; 327/108, 109
See application file for complete search history.

(56) References Cited

U.S. PATENT DOCUMENTS

| | | | | |
|---|---|---|---|---|
| 7,057,672 | B2 * | 6/2006 | Sandhu et al. | ................ 348/723 |
| 7,193,467 | B2 * | 3/2007 | Garlepp et al. | ............... 330/259 |
| 7,288,967 | B2 * | 10/2007 | Byun et al. | ...................... 326/83 |
| 7,541,838 | B2 | 6/2009 | Tian et al. | |
| 7,570,714 | B2 | 8/2009 | Hori et al. | |
| 2003/0085736 | A1 * | 5/2003 | Tinsley et al. | .................. 326/81 |
| 2007/0071111 | A1 | 3/2007 | Muljono et al. | |
| 2007/0075776 | A1 * | 4/2007 | Garlapati et al. | ............. 330/259 |
| 2008/0238482 | A1 | 10/2008 | Tian et al. | |
| 2009/0006022 | A1 * | 1/2009 | Tian et al. | ..................... 702/122 |
| 2013/0120020 | A1 * | 5/2013 | Li et al. | .......................... 326/30 |

OTHER PUBLICATIONS

Non-Final Office Action for U.S. Appl. No. 12/387,695, mailed Aug. 25, 2011, 9 pages.
Notice of Allowance mailed Jan. 21, 2009 for U.S. Appl. No. 11/729,209.
Non-Final Office Action mailed Apr. 3, 2008 for U.S. Appl. No. 11/729,209.
Notice of Allowance mailed Feb. 24, 2012 for U.S. Appl. No. 12/387,695.
Notice of Allowance mailed May 2, 2012 for U.S. Appl. No. 12/387,695.

* cited by examiner

*Primary Examiner* — Dylan White
(74) *Attorney, Agent, or Firm* — Blakely, Sokoloff, Taylor & Zafman LLP

(57) ABSTRACT

Disclosed herein are embodiments of a swing compensation scheme for compensating errors in a transmitter driver.

17 Claims, 3 Drawing Sheets

US 9,118,317 B2

TRANSMITTER SWING CONTROL CIRCUIT AND METHOD

CLAIM OF PRIORITY

The present application is a Continuation of, and claims priority to and incorporates by reference, the corresponding U.S. patent application Ser. No. 12/387,695 filed May 6, 2009, and entitled "Transmitter Swing Control Circuit and Method," and issued as U.S. Pat. No. 8,264,253 on Sep. 11, 2012, which is a Continuation of, and claims priority to and incorporates by reference, the corresponding U.S. patent application Ser. No. 11/729,209 filed Mar. 27, 2007, and entitled "Transmitter Swing Control Circuit and Method," and issued as U.S. Pat. No. 7,541,838 on Jun. 2, 2009.

BACKGROUND

Chip-to-chip communication is commonly implemented with high-speed, point-to-point links such as with differential point-to-point links transmitting differential data signals. Achievable data rates can be affected by voltage and timing margins of the transmitted signals. For example, deviations from specified transmitted voltage swings during operation can result in decreased margins and therefore a decreased data-rate. Unfortunately, it is difficult to control voltage swing levels because they vary with operating environment changes such as with changes in PVT (process, voltage, and temperature). Because PVT changes generally affect the various transmitter circuits within a chip the same, chips typically incorporate one or more distributed general compensation circuits to control multiple transmitter circuits reasonably proximal to the compensation circuit to compensate for such PVT variations.

FIG. 1 shows a conventional multi-bit point-to-point link with global current compensation (I-Comp) and termination resistance compensation (R-Comp) to control (e.g., keep reasonably constant) drive currents and termination resistances in accordance with design specifications. It comprises N transmitter drivers 101 to be coupled to N corresponding receivers (e.g., on a different chip, not shown). Each driver has an associated pair of variable termination resistors to convey differential data signals (Dini, Dini#). Also included is a global current compensation (I-Comp) circuit 103, which uses a reference current (I-Ref) to generate and distribute multiple copies of current, $I_1$ through $I_N$, to each individual TX driver (Tx1 to TxN). The current is used to generate a desired output swing that is also affected by the values of the termination resistors. A global resistance compensation (R-Comp) circuit 105 is also included to generate resistance compensation signals from an R-Ref control resistor.

Unfortunately, however, within-die systematic and random process variations between the compensation circuits and the transmitter circuits they service, as well as between the transmitter circuit instances themselves, can undue some of the compensation achieved by the general compensation circuits. Thus, using such compensation circuits can still result in errors in the transmitter output voltage swing and thereby decrease the voltage margin available at the receiver decreasing achievable data rates. Accordingly, new solutions are desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
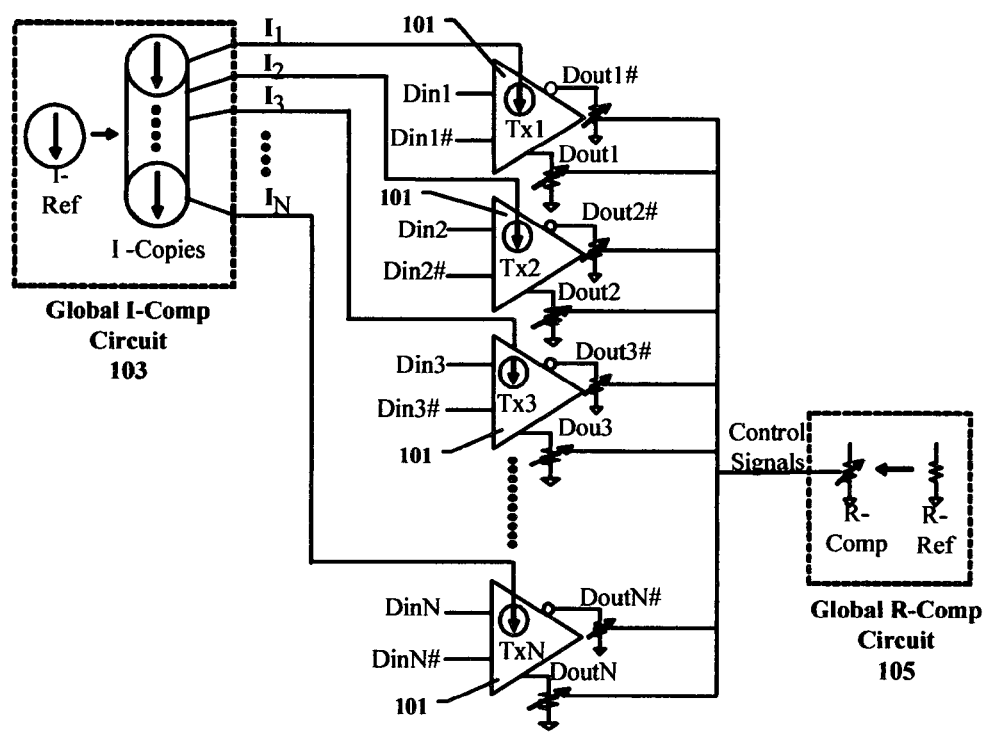
FIG. 1 is a schematic diagram of a conventional multi-bit, point-to-point link with global transmitter driver compensation.
Figure 2:
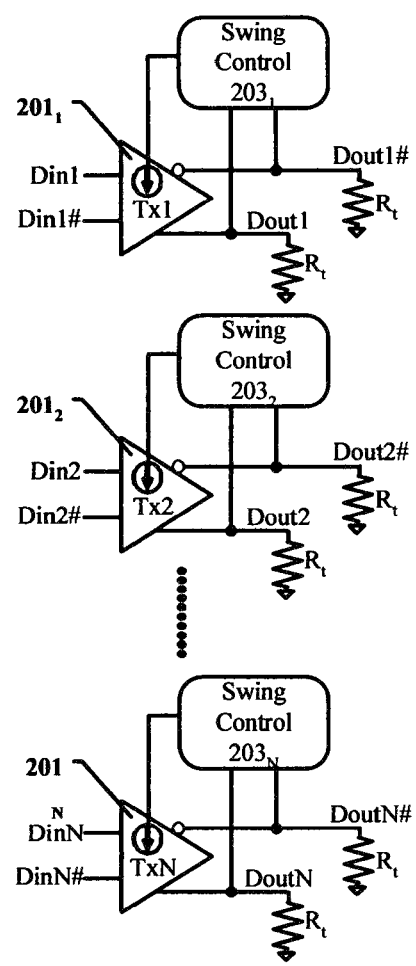
FIG. 2 is a schematic diagram of a multi-bit, point-to-point link with per-lane transmitter driver-current compensation in accordance with some embodiments.

FIG. 2 shows N differential transmitter drivers ($201_1$ to $201_N$) for a multi-bit point-to-point communications link. Each driver has differential inputs (Dini, Dini#) to receive a differential data input signal and a differential output (Douti, Douti#) coupled to termination resistors $R_t$ to provide a differential output signal to be transmitted, e.g., off-chip to a corresponding receiver.

Each driver circuit also has an associated swing control circuit $203_i$ coupled between its output nodes and a current source controlling its strength to control the current source for an output swing within a desired tolerance. In some embodiments, the swing control circuit differentially measures a test output, in both directions (i.e., Douti/Douti# and Douti#/Douti) to compensate for fluctuations in either termination resistor, as well as in either side of the differential driver amplifier. It may be done dynamically, e.g., on an operating test clock, which may also enhance its accuracy. (Note that while in the depicted embodiment, neither global current nor global resistance compensation is shown; however, either or both global current and resistance compensation circuits may or may not be included with the use of local swing control circuits disclosed herein).

Figure 3:
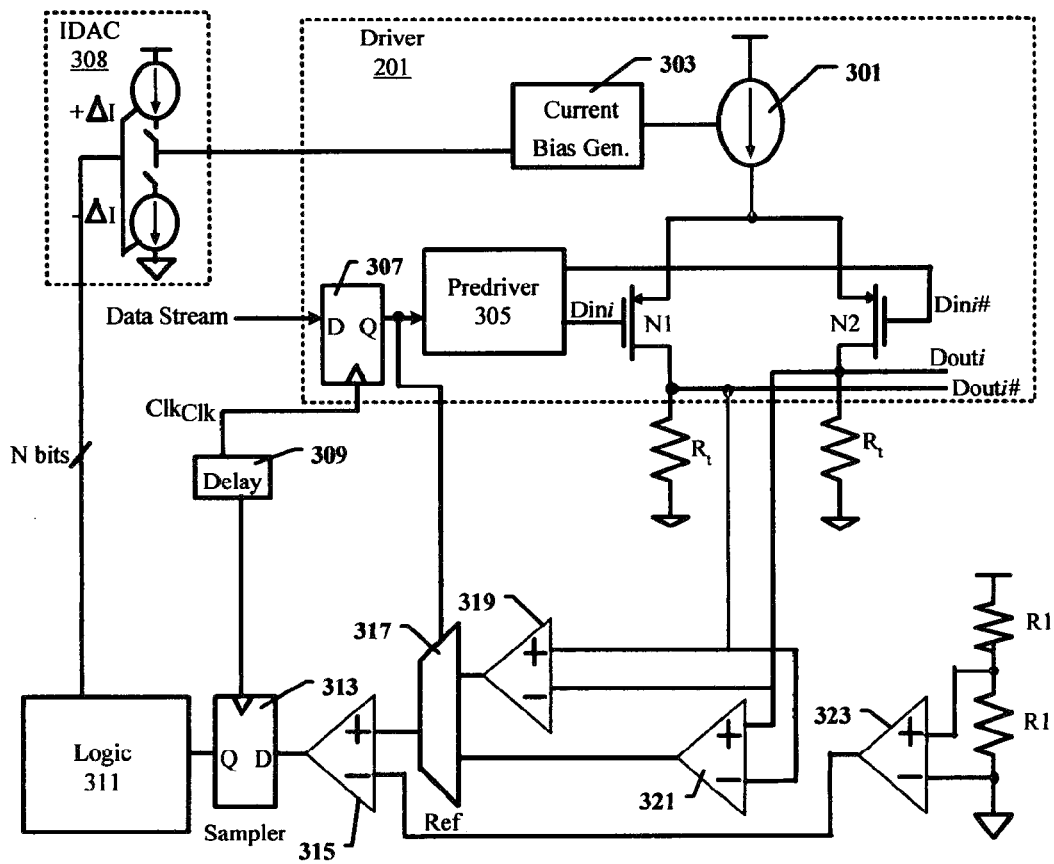
FIG. 3 is a schematic diagram of a swing control circuit to control voltage swing for a differential transmitter in accordance with some embodiments.

FIG. 3 shows an exemplary swing control circuit 203 coupled to a differential transmitter driver 201. The driver circuit 201 comprises transistors N1, N2, adjustable current source 301, current bias generator 303, pre-driver 305, and latch 307, all coupled together as shown. The predriver 305 converts a single-ended data stream, from latch 307, to a corresponding differential input signal (Dini, Dini#) to be driven through transistors N1 and N2 onto termination resistors $R_t$ as shown. The current bias generator 303 controls the strength of current source 301, which thereby allows it to control the strength of the differential amplifier formed from N1 and N2. Thus, by increasing or decreasing current in the bias generator, the output swing (magnitude of Douti/Douti#) can correspondingly be adjusted.

The swing control circuit 203 is coupled to the current bias generator 303 to increase or decrease its current in order to correspondingly adjust current source 301 to maintain the output swing within a desired range. The swing control circuit 203 generally comprises current-mode digital-to-analog converter (IDAC) 308, clock delay 309, logic 311, sampler latch 313, comparator 315, multiplexer 317, linear amplifiers 319 to 323, and resistors R1, all coupled together as shown.

Resistors R1 are coupled between a supply voltage (e.g., the supply used to power driver 201) and to amplifier 321 to generate a reference (VCC/2 in the depicted embodiment) buffered and provided at the output of Amplifier 323. It corresponds to the target swing magnitude and is thus coupled to the negative input of comparator 315 to function as a reference against the actual swing magnitude (measured in either direction).

Linear amplifiers 319, 321 are coupled to the output nodes (Douti, Douti#) to measure the differenced between them in each direction, i.e., Douti/Douti# (D+/D−) and Douti#/Douti (D−/D+). The output from each amplifier (319, 321) is coupled to one of the inputs of 2:1 multiplexer 317. In the depicted embodiment, the select control line for multiplexer 317 is coupled to the output of latch 307. In this way, depending on the input data value, the appropriate amplifier (319 when N2 is active or 321 when N1 is the active transistor) is selected to provide to amplifier 315 the appropriate difference (D+/D− or D−/D+). (Note that the multiplexer could be controlled from any desired block, e.g., it could be controlled by the logic 311). Thus, D+/D− and D−/D+ can be separately tuned (or calibrated).

The output from multiplexer 317 is coupled to a comparator (which may be implemented with a wide mode type amplifier), where it is compared against the target reference. If it is smaller than the reference, then a '0' is output from the comparator, and if it is greater than the reference, then a '1' is output from it.

The delay circuit 309 serves to clock the comparison result through sample latch 313 after a delay (e.g., ¼ clock cycle) from when the data was clocked to predriver 305. Such a delay may be used to ensure that an accurate sample, taking into account rise/fall times, is obtained. The latched value, indicating if the difference is too small or too large, is provided to logic 311. Logic 311 may include appropriate logic, e.g., counter(s), finite state machine, averaging circuitry, to provide an N-bit digital control signal to IDAC 308 to appropriately increase, decrease, or maintain the strength of the driver 201 in response to the difference between D+/D− and the reference, as well as between D−/D+ and the reference value. For example, in some embodiments, it could comprise logic to control a 5-bit up/down counter to provide a 5-bit control signal to IDAC 308.

An exemplary operation for the circuitry of FIG. 3 will now be discussed. initially, before the error for either swing direction is determined, the logic 311 sets its counter (used to control IDAC 305) to a midway value (e.g., '10000 for a 5-bit counter. Next, the swing error (or needed compensation) for a first swing direction (e.g., D+/D−) is determined. To do this, a test data stream (e.g., a toggling data stream at an operational rate such as 6.4 GHz.) may be clocked through latch 307 to predriver 305. Assume that the D+/D− swing error is to initially be determined. This corresponds to N2 being turned on harder than N1, which occurs when the input data is '0,' i.e., N2 is turned on and N1 is turned off.

The logic 311 receives from the sampler latch 313 a digital value indicating whether the D+/D− swing difference is too high or too low. If too high, it decrements the counter to decrease driver strength and if too low, it increments the counter to increase counter strength. It does this over multiple clock cycles, if necessary, until the D+/D− swing magnitude is sufficiently close to its desired (e.g., target reference) value. The count value used to achieve this is retained in memory within the logic 311.

Next, the same process is repeated for the D−/D+ swing difference. In some embodiments, the obtained compensation count value is then averaged with the saved count value for the D+/D− polarity, and the result is applied to IDAC 305 for normal transmission operations.

Figure 4:
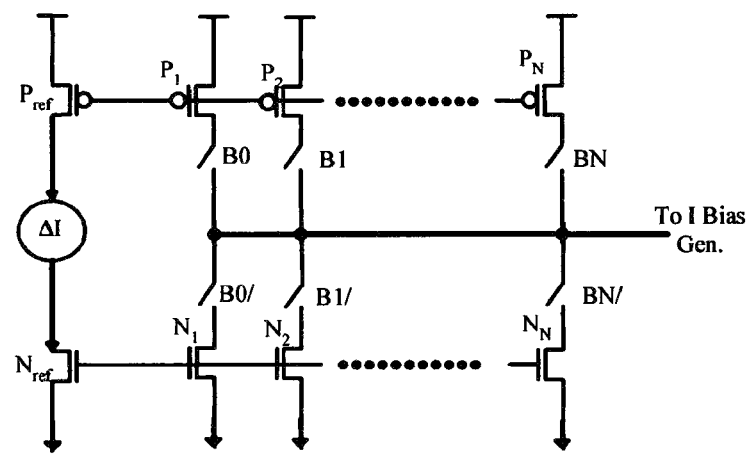
FIG. 4 is a schematic diagram of a current-mode digital to analog converter in accordance with some embodiments.

FIG. 4 shows an exemplary IDAC circuit 305. It generally comprises reference transistors $P_{ref}$, $N_{ref}$ and N P-type and N N-type transistors, and switching circuitry, coupled together as shown. (The value of N corresponds to the number of bits from the logic 311 used to control current generated in IDAC 305). The transistors are all controllably coupled to a common IDAC output that is supplied to the current bias generator 303. In the depicted embodiment, associated P and N transistors are configured into complementary pairs, and the pairs are binary weighted with respect to one another. In the depicted embodiment, P1 and N1 are the least significant (smallest) transistors, while $P_N$ and $N_N$ are the most significant (strongest) transistors. Thus, the P2 transistor is twice the strength of P1, P3 is twice the strength of P2, and so on. In this way, $2^N$ different discrete current levels can be achieved in response to the N-bit signal from logic 311.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chipset components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the figures for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip comprising:
a differential driver to provide a differential output, the differential output having a first output signal with first swing level and a second output signal with second swing level; and
a swing control circuit coupled to the differential driver, the swing control circuit including a selector unit which is operable to select one of a first signal, indicating a first difference between the first and second swing levels, and a second signal, indicating a second difference between the second and first swing levels, wherein the swing control circuit is operable to adjust current bias of the differential driver to maintain the first and second swing levels in a predetermined range according to the first and second differences.

2. The chip of claim 1, wherein the swing control circuit comprises:
a first amplifier to receive first and second output signals, the first amplifier to generate the first signal indicating the first difference; and
a second amplifier to receive first and second output signals, the second amplifier to generate the second signal indicating the second difference.

3. The chip of claim 2 further comprises a comparator coupled to the selector unit, the comparator to compare an output of the selector unit with a reference signal.

4. The chip of claim 3 further comprises a sampler to sample an output of the comparator.

5. The chip of claim 1 further comprises a digital-to-analog converter (DAC) to adjust current bias of the differential driver to maintain the first and second swing levels in the predetermined range.

6. The chip of claim 5 further comprises a logic unit to generate input for the DAC according to a difference between the selected one of the first or second signals and a reference signal.

7. The chip of claim 6, wherein the logic unit comprises at least one of:
a counter;
a finite state machine; or
an averaging circuit.

8. A chip comprising:
a differential driver to provide a differential output, the differential output having a first output signal with first swing level and a second output signal with second swing level; and
a swing control circuit coupled to the differential driver, the swing control circuit including a selector unit which is operable to select one of a first signal, indicating a first difference between the first and second swing levels, and a second signal, indicating a second difference between the second and first swing levels; and
a logic unit to generate a select signal for the selector circuit, wherein the logic unit to generate the select signal according to input data received by the differential driver for transmission by the differential driver.

9. A chip comprising:
a differential driver to provide a differential output, the differential output having a first output signal with first swing level and a second output signal with second swing level; and
a swing control circuit coupled to the differential driver to determine a first difference between the first and second swing levels and a second difference between the second and first swing levels, wherein the swing control circuit is operable to adjust current bias of the differential driver to maintain the first and second swing levels in a predetermined range according to the determined first and second differences, wherein the swing control circuit comprises a selector circuit which is operable to select one of the first and second signals, the output of the selector circuit being a third signal.

10. The chip of claim 9, wherein the swing control circuit comprises:
a first amplifier to receive first and second output signals, the first amplifier to generate a first signal indicating the first difference.

11. The chip of claim 10, wherein the swing control circuit comprises:
a second amplifier to receive first and second output signals, the second amplifier to generate a second signal indicating the second difference.

12. The chip of claim 9 further comprises a logic unit to generate a select signal for the selector circuit, wherein the logic unit to generate the select signal according to input data for transmission by the differential driver.

13. The chip of claim 9 further comprises a third amplifier to compare the third signal to a reference signal, the third amplifier to generate a fourth signal for adjusting current strength of the differential driver.

14. A chip comprising:
a differential driver to provide a differential output, the differential output having a first output signal with first swing level and a second output signal with second swing level; and
a swing control circuit coupled to the differential driver to determine a first difference between the first and second swing levels and a second difference between the second and first swing levels, wherein the swing control circuit is operable to adjust current bias of the differential driver to maintain the first and second swing levels in a predetermined range according to the determined first and second differences, wherein the swing control circuit comprises
a digital-to-analog converter (DAC) to adjust current bias of the differential driver to maintain the first and second swing levels in the predetermined range.

15. An apparatus comprising:
a plurality of differential transmitter drivers for a multi-bit point-to-point communication link, wherein each of the differential transmitter drivers to receive a differential data input signal and to generate a differential output signal having first and second swing levels; and
a plurality of swing control units, each coupled to a corresponding differential transmitter driver from the plurality of differential transmitter drivers to compensate signal swings of the differential output signal, and each swing control unit to measure a first difference between the first and second swing levels and a second difference between the second and first swing levels, the plurality of swing control units to maintain the signal swings of the differential output signals in a predetermined range according to the measured first and second differences, wherein each of the swing control circuit comprises a first amplifier to receive first and second output signals, the first amplifier to generate a first signal indicating the first difference.

16. The apparatus of claim 15, wherein each of the swing control circuit comprises:
a second amplifier to receive first and second output signals, the second amplifier to generate a second signal indicating the second difference.

17. The apparatus of claim 16, wherein each of the swing control circuit comprises:
a selector circuit which is operable to select one of the first and second signals, the output of the selector circuit being a third signal; and
a comparator to compare the third signal with a reference signal, and to generate a compare signal for adjusting a current strength of the differential transmitter driver to maintain the signal swings of the differential output signals in a predetermined range.

* * * * *